(12) United States Patent
Jiang et al.

(10) Patent No.: US 7,923,731 B2
(45) Date of Patent: Apr. 12, 2011

(54) THIN FILM TRANSISTOR

(75) Inventors: Kai-Li Jiang, Beijing (CN); Qun-Qing Li, Beijing (CN); Shou-Shan Fan, Beijing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/384,292

(22) Filed: Apr. 2, 2009

(65) Prior Publication Data

US 2009/0283770 A1 Nov. 19, 2009

(30) Foreign Application Priority Data

May 14, 2008 (CN) .......................... 2008 1 0067159

(51) Int. Cl.
*H01L 29/76* (2006.01)
*H01L 31/036* (2006.01)
*H01L 31/112* (2006.01)

(52) U.S. Cl. .................. 257/66; 257/E29.273; 438/478

(58) Field of Classification Search .................. 257/66, 257/E29.273, E29.082; 438/478
See application file for complete search history.

(56) References Cited

U.S. PATENT DOCUMENTS

| | | | |
|---|---|---|---|
| 6,423,583 B1 | 7/2002 | Avouris et al. | |
| 6,814,832 B2 | 11/2004 | Utsunomiya | |
| 6,921,575 B2 | 7/2005 | Horiuchi et al. | |
| 7,141,816 B2 | 11/2006 | Noda | |
| 7,285,501 B2 * | 10/2007 | Mardilovich et al. | 438/763 |
| 7,399,400 B2 | 7/2008 | Soundarrajan et al. | |
| 7,537,975 B2 | 5/2009 | Moon et al. | |
| 2002/0163079 A1 | 11/2002 | Awano | |
| 2004/0251504 A1 | 12/2004 | Noda | |
| 2005/0061496 A1 | 3/2005 | Matabayas, Jr. | |
| 2005/0079659 A1 | 4/2005 | Duan et al. | |
| 2005/0106846 A1 | 5/2005 | Dubin et al. | |
| 2005/0189535 A1 | 9/2005 | Hsueh et al. | |
| 2006/0249817 A1 | 11/2006 | Kawase et al. | |
| 2007/0004191 A1 | 1/2007 | Gu et al. | |
| 2007/0012922 A1 * | 1/2007 | Harada et al. | 257/66 |
| 2007/0029612 A1 | 2/2007 | Sandhu | |
| 2007/0069212 A1 | 3/2007 | Saitoh et al. | |
| 2007/0085460 A1 | 4/2007 | Harutyunyan et al. | |

(Continued)

FOREIGN PATENT DOCUMENTS

CN 1484865 3/2004

(Continued)

OTHER PUBLICATIONS

R. E. I. Schropp, B. Stannowski, J. K Rath, New challenges in thin film transistor research, Journal of Non-Crystalline Solids, 299-302, 2002,1304-1310,2002.

(Continued)

*Primary Examiner* — Phuc T Dang
(74) *Attorney, Agent, or Firm* — D. Austin Bonderer

(57) ABSTRACT

A thin film transistor includes a source electrode, a drain electrode, a semiconducting layer, and a gate electrode. The drain electrode is spaced from the source electrode. The semiconducting layer is connected to the source electrode and the drain electrode. The gate electrode is insulated from the source electrode, the drain electrode, and the semiconducting layer by an insulating layer. The semiconducting layer includes a carbon nanotube layer, and the carbon nanotube layer comprises a plurality of semiconducting carbon nanotubes.

20 Claims, 5 Drawing Sheets

U.S. PATENT DOCUMENTS

| | | | |
|---|---|---|---|
| 2007/0108480 A1 | 5/2007 | Nanai et al. | |
| 2007/0132953 A1 | 6/2007 | Silverstein | |
| 2007/0138010 A1 | 6/2007 | Ajayan | |
| 2007/0273796 A1 | 11/2007 | Silverstein et al. | |
| 2007/0273797 A1 | 11/2007 | Silverstein et al. | |
| 2007/0273798 A1 | 11/2007 | Silverstein et al. | |
| 2008/0042287 A1 | 2/2008 | Furukawa et al. | |
| 2008/0134961 A1* | 6/2008 | Bao et al. | 117/86 |
| 2008/0173864 A1 | 7/2008 | Fujita et al. | |
| 2008/0252202 A1 | 10/2008 | Li et al. | |
| 2008/0265293 A1 | 10/2008 | Lee et al. | |
| 2008/0277718 A1 | 11/2008 | Ionescu et al. | |
| 2009/0098453 A1* | 4/2009 | Liu et al. | 429/163 |
| 2009/0159891 A1* | 6/2009 | Daniel et al. | 257/66 |
| 2009/0224292 A1 | 9/2009 | Asano et al. | |
| 2009/0272967 A1 | 11/2009 | Afzali-Ardakani et al. | |
| 2009/0282802 A1 | 11/2009 | Cooper et al. | |
| 2010/0028613 A1 | 2/2010 | Schmidt et al. | |

FOREIGN PATENT DOCUMENTS

| | | |
|---|---|---|
| CN | 1490856 A | 4/2004 |
| CN | 1745468 | 3/2006 |
| CN | 1823426 | 8/2006 |
| CN | 1853268 | 10/2006 |
| JP | 2007-73706 | 3/2007 |
| JP | 2007-123870 | 5/2007 |
| JP | 2009-32894 | 2/2009 |
| WO | WO2004032193 | 4/2004 |
| WO | WO2006093601 A2 | 9/2006 |
| WO | WO2007089322 | 8/2007 |
| WO | WO2007126412 | 11/2007 |
| WO | WO2008075642 | 6/2008 |

OTHER PUBLICATIONS

Li "Removal of shells of multi-wall carbon nanotubes by repeatedly scanning bias voltage" Science in China Ser. E Technological Sciences 2004 vol. 47 No. 1 pp. 1-5.

Ryu "Low-Temperature Growth of Carbon nanotube by Plasma-Enhanced Chemical Vapor Deposition using Nickel Catalyst", Jpn. J. Appl. Phys. vol. 42 (2003) pp. 3578-3581.

IBM research article on IBM research site 2004 http://www.research.ibm.com/resources/press/Transistors/ the website was accessed at Jun. 30, 2010.

Hines "Nanotransfer printing of organic and carbon nanotube thin-film transistors on plastic substrates", Applied Physics Letters 86, 163101(2005).

Jiang et al. ( "Spinning and processing continuous yarns from 4-inch wafer scale super-aligned carbon nanotube arrays" Advanced Materials, 18, pp. 1505-1510, 2006 ).

Minko et al. "Two-level structured self-adaptive surfaces with reversibly tunable properties", Journal of American Chemical Society, 125, pp. 3896-3900, 2003.

Meitl et al., Solution Casting and Transfer Printing Single-Walled Carbon Nanotube Films, Nano Letters, 2004, vol. 4, No. 9.

* cited by examiner

THIN FILM TRANSISTOR

RELATED APPLICATIONS

This application is related to commonly-assigned applications entitled, "METHOD FOR MAKING THIN FILM TRANSISTOR", U.S. patent application Ser. No. 12/384,245, filed Apr. 2, 2009; "METHOD FOR MAKING THIN FILM TRANSISTOR", U.S. patent application Ser. No. 12/384,331, filed Apr. 2, 2009; "THIN FILM TRANSISTOR" U.S. patent application Ser. No. 12/384,329, filed Apr. 2, 2009; "THIN FILM TRANSISTOR", U.S. patent application Ser. No. 12/384,310, filed Apr. 2, 2009; "THIN FILM TRANSISTOR PANEL", U.S. patent application Ser. No. 12/384,309, filed Apr. 2, 2009; "THIN FILM TRANSISTOR PANEL", U.S. patent application Ser. No. 12/384,244, filed Apr. 2, 2009; "THIN FILM TRANSISTOR", U.S. patent application Ser. No. 12/384,281, filed Apr. 2, 2009; "THIN FILM TRANSISTOR", U.S. patent application Ser. No. 12/384,330, filed Apr. 2, 2009; "THIN FILM TRANSISTOR", U.S. patent application Ser. No. 12/384,299, filed Apr. 2, 2009; "THIN FILM TRANSISTOR", U.S. patent application Ser. No. 12/384,293, filed Apr. 2, 2009; "METHOD FOR MAKING THIN FILM TRANSISTOR", U.S. patent application Ser. No. 12/384,241, filed Apr. 2, 2009; and "THIN FILM TRANSISTOR", U.S. patent application Ser. No. 12/384,238, filed Apr. 2, 2009. The disclosures of the above-identified applications are incorporated herein by reference.

BACKGROUND

1. Technical Field

The present invention relates to thin film transistors and, particularly, to a carbon nanotube based thin film transistor.

2. Discussion of Related Art

A typical thin film transistor (TFT) is made of a substrate, a gate electrode, an insulation layer, a drain electrode, a source electrode, and a semiconducting layer. The thin film transistor performs a switching operation. In use, the thin film transistor modulates carriers in an interface between the insulation layer and the semiconducting layer from an accumulation state to a depletion state, with voltage applied to the gate electrode. Thus, the thin film transistor can change the amount of the current between the drain electrode and the source electrode. In practical use, a high carrier mobility affect of the material of the semiconducting layer of the thin film transistor is desired.

Previously, the material of the semiconducting layer has been amorphous silicone (a-Si), poly-silicone (p-Si), or organic semiconducting material. The carrier mobility of an a-Si thin film transistor is relatively lower than a p-Si thin film transistor. However, the method for making the p-Si thin film transistor is complicated and has a high cost. The organic thin film transistor is flexible but has low carrier mobility.

Carbon nanotubes (CNTs) are a novel carbonaceous material and have received a great deal of interest since the early 1990s. Carbon nanotubes have interesting and potentially useful heat conducting, electrical conducting, and mechanical properties. Further, there are two kinds of carbon nanotubes: metallic carbon nanotubes and semiconducting carbon nanotubes determined by the arrangement of the carbon atoms therein. The carrier mobility of the semiconducting carbon nanotubes along a length direction thereof can reach about 1000 to 1500 $cm^2V^{-1}s^{-1}$. Thus a thin film transistor adopting carbon nanotubes as a semiconducting layer has been produced.

A conventional carbon nanotube based thin film transistor is generally made by printing the mixture of carbon nanotubes and a polymer on a substrate to form a semiconducting layer. But the semiconducting layers of the conventional carbon nanotube based thin film transistor commonly include a plurality of metallic carbon nanotubes. This will result in current leakage from the source electrode to the drain electrode. Thus, the on/off current ratio of the thin film transistor using the carbon nanotube layer as a semiconducting layer is relatively low.

What is needed, therefore, is providing a carbon nanotubes based thin film transistor that has a better on/off current ratio.

BRIEF DESCRIPTION OF THE DRAWINGS

Many aspects of the present carbon nanotubes based thin film transistor can be better understood with references to the following drawings. The components in the drawings are not necessarily drawn to scale, the emphasis instead being placed upon clearly illustrating the principles of the present thin film transistor.

Figure 1:
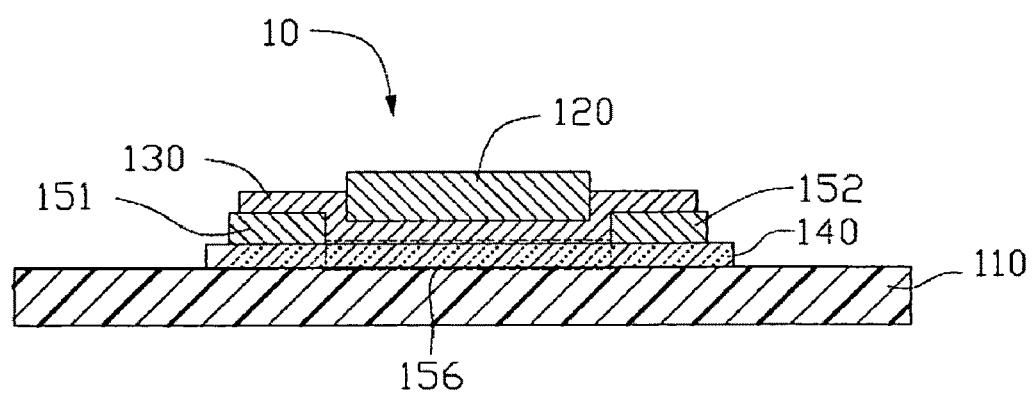
FIG. 1 is a cross sectional view of a thin film transistor in accordance with a first embodiment.

Corresponding reference characters indicate corresponding parts throughout the several views. The exemplifications set out herein illustrate at least one embodiment of the present thin film transistor, in at least one form, and such exemplifications are not to be construed as limiting the scope of the disclosure in any manner.

DETAILED DESCRIPTION OF EXEMPLARY EMBODIMENTS

References will now be made to the drawings to describe, in detail, embodiments of the present thin film transistor.

Referring to FIG. 1, a thin film transistor 10 is provided in a first embodiment, and has a top gate structure. The thin film transistor 10 includes a semiconducting layer 140, a source electrode 151, a drain electrode 152, an insulating layer 130, and a gate electrode 120. The thin film transistor 10 is located on an insulating substrate 110.

The semiconducting layer 140 is located on the insulating substrate 110. The source electrode 151 and the drain electrode 152 are electrically connected to the semiconducting layer 140 and spaced from each other a certain distance. The insulating layer 130 is located between the semiconducting layer 140 and the gate electrode 120. The insulating layer 130 is located at least on the semiconducting layer 140, or covers at least part of the semiconducting layer 140, the source electrode 151, and the drain electrode 152. The gate electrode 120 is located on the insulating layer 130. The gate electrode 120 is located above the semiconducting layer 140 and insulated from the semiconducting layer 140, the source electrode 151, and the drain electrode 152 by the insulating layer 130. A channel 156 is formed in the semiconducting layer 140 at a region between the source electrode 151 and the drain electrode 152.

The source electrode 151 and the drain electrode 152 can be located on the semiconducting layer 140 or on the insulating substrate 110. More specifically, the source electrode 151 and the drain electrode 152 can be located on a top surface of the semiconducting layer 140, and on a same side of the semiconducting layer 140 as the gate electrode 120. In other embodiments, the source electrode 151 and the drain electrode 152 can be located on the insulating substrate 110 and covered by the semiconducting layer 140. The source electrode 151 and the drain electrode 152 are located on different sides of the semiconducting layer 140. In other embodiments, the source electrode 151 and the drain electrode 152 can be formed on the insulating substrate 110, and coplanar with the semiconducting layer 140.

The insulating substrate 110 is provided for supporting the thin film transistor 10. The material of the insulating substrate 110 can be the same as a substrate of a printed circuit board (PCB), and can be selected from rigid materials (e.g., p-type or n-type silicon, silicon with an silicon dioxide layer formed thereon, crystal, crystal with a oxide layer formed thereon), or flexible materials (e.g., plastic or resin). In the present embodiment, the material of the insulating substrate is glass. The shape and size of the insulating substrate 110 is arbitrary. A plurality of thin film transistors 10 can be located on a single insulating substrate 110 to form a thin film transistor panel.

The material of the semiconducting layer 140 can be selected from a group consisting of amorphous silicone (a-Si), poly-silicone (p-Si), organic semiconducting material, or semiconducting carbon nanotubes. In the present embodiment, the semiconducting layer 140 is a carbon nanotube layer. The carbon nanotube layer includes a plurality of semiconducting carbon nanotubes. The semiconducting carbon nanotubes in the carbon nanotube layer can be an ordered or a disordered.

The carbon nanotube layer includes a plurality of single-walled carbon nanotubes, double-walled carbon nanotubes, or combination thereof. The diameter of the single-walled carbon nanotubes ranges from about 0.5 nanometers to about 5 nanometers. The diameter of the double-walled carbon nanotubes ranges from about 1.0 nanometer to about 5 nanometers. It has been found that the energy gap of the carbon nanotubes is in inverse proportion to the diameter of the carbon nanotubes. The leakage current of the TFT is also inverse proportion to the energy gap of semiconducting layer. So, the leakage current of the TFT is in direct proportion to the diameter of the carbon nanotubes. In the present embodiment, the diameter of the semiconducting carbon nanotubes is less than 2 nanometers. Thus, the resulting on/off current ratio of the thin film transistor using the carbon nanotube layer as a semiconducting layer is relatively high.

Figure 2:
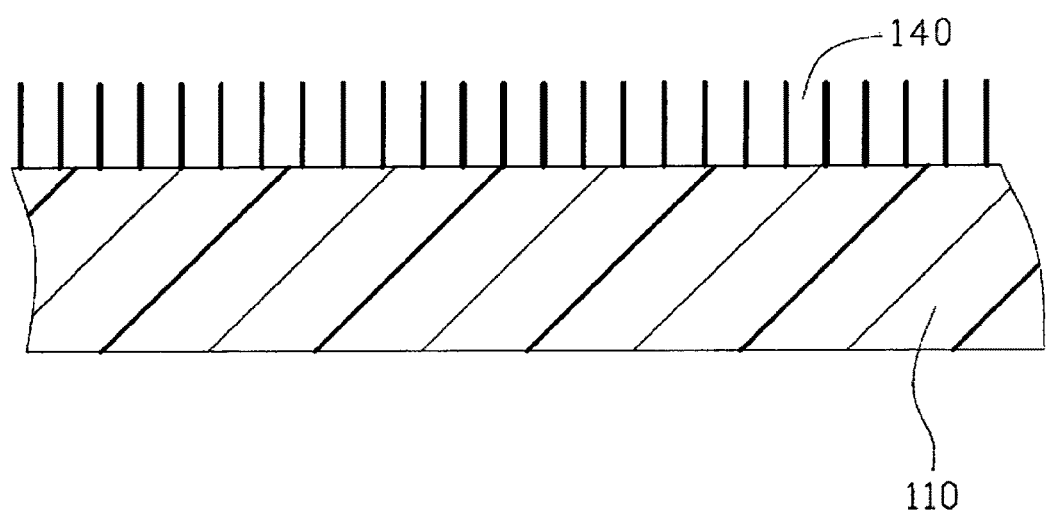
FIG. 2 is a cross sectional view of a semiconducting layer formed by a carbon nanotube array of the thin film transistor in accordance with a first embodiment.

Referring to FIG. 2, the carbon nanotube layer can be a carbon nanotube array that includes a plurality of ordered semiconducting carbon nanotubes. The carbon nanotubes are perpendicular to the insulating substrate 110. A thickness of the semiconducting carbon nanotube layer ranges from about 0.5 nanometers to about 100 microns. The diameter of the semiconducting carbon nanotubes is less than 2 nanometers.

Figure 3:
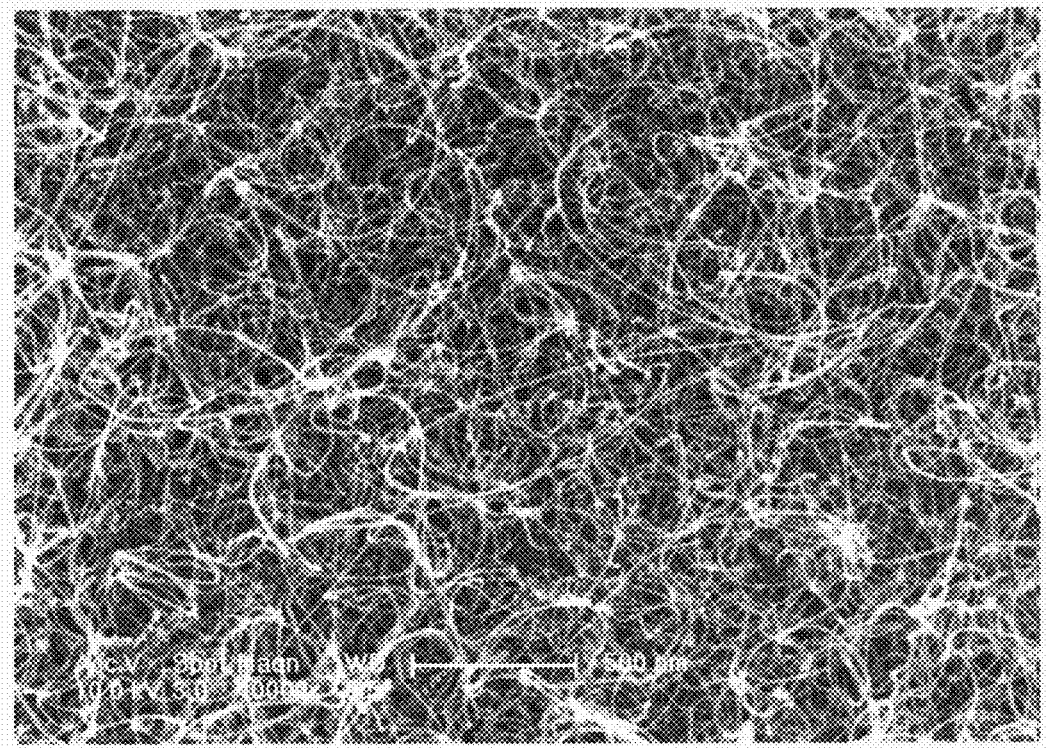
FIG. 3 shows a Scanning Electron Microscope (SEM) image of a carbon nanotube film used in the thin film transistor of FIG. 1.

Referring to FIG. 3, the carbon nanotube layer can be a free-standing carbon nanotube film that includes a plurality of disordered semiconducting carbon nanotubes. Further, the free-standing carbon nanotube film is isotropic. The semiconducting carbon nanotubes in the carbon nanotube layer are disordered, and are entangled together by van der Waals attractive force therebetween. The tangled semiconducting carbon nanotubes form a network structure. The network structure includes a plurality of micropores formed by the disordered semiconducting carbon nanotubes. Thus, the thin film transistor 10 using the carbon nanotube layer as semiconducting layer 140 will have a high light transmittance. The diameter of the micropores is less than 50 microns. A thickness of the carbon nanotube layer ranges from about 0.5 nanometers to about 100 microns. The diameter of the semiconducting carbon nanotube is less than 2 nanometers.

A length of the semiconducting layer 140 ranges from about 1 micron to about 100 microns. A width of the semiconducting layer 140 ranges from about 1 micron to about 1 millimeter. A thickness of the semiconducting layer 140 ranges from about 0.5 nanometers to about 100 microns. A length of the channel 156 ranges from about 1 micron to about 100 microns. A width of the channel 156 ranges from about 1 micron to about 1 millimeter. In the present embodiment, the length of the semiconducting layer 140 is about 50 microns, the width of the semiconducting layer 140 is about 300 microns, the thickness of the semiconducting layer 140 is about 1 micron, the length of the channel 156 is about 40 microns, and the width of the channel 156 is about 300 microns. The semiconducting layer 140 includes at least one disordered carbon nanotube film.

The material of the source electrode 151, the drain electrode 152 and the gate electrode 120 has a good conductive property, and can be selected from a group consisting of pure metals, metal alloys, indium tin oxide (ITO), antimony tin oxide (ATO), silver paste, conductive polymer, and metallic carbon nanotubes. The pure metals and metal alloys can be selected from a group consisting of aluminum, copper, tungsten, molybdenum, gold, cesium, palladium and combinations thereof. A thickness of the source electrode 151, the drain electrode 152 and the gate electrode 120 ranges from about 0.5 nanometers to about 100 microns. A distance between the source electrode 151 and the drain electrode 152 ranges from about 1 to about 100 microns.

In one embodiment, when the source electrode 151 and the drain electrode 152 are made of pure metals, metal alloys, indium tin oxide (ITO), or antimony tin oxide (ATO), a conducting layer can be formed by a depositing, sputtering, evaporating method, and etched to form the source electrode 151 and the drain electrode 152. In another embodiment, the source electrode 151 and the drain electrode 152 made of silver paste or conductive polymer can be formed directly by a print method.

The material of the insulating layer 130 can be a rigid material such as silicon nitride ($Si_3N_4$) or silicon dioxide ($SiO_2$), or a flexible material such as polyethylene terephthalate (PET), benzocyclobutenes (BCB), or acrylic resins. A thickness of the insulating layer 130 ranges from about 5 nanometers to about 100 microns. In the present embodiment, the insulating layer 130 is $Si_3N_4$.

Figure 4:
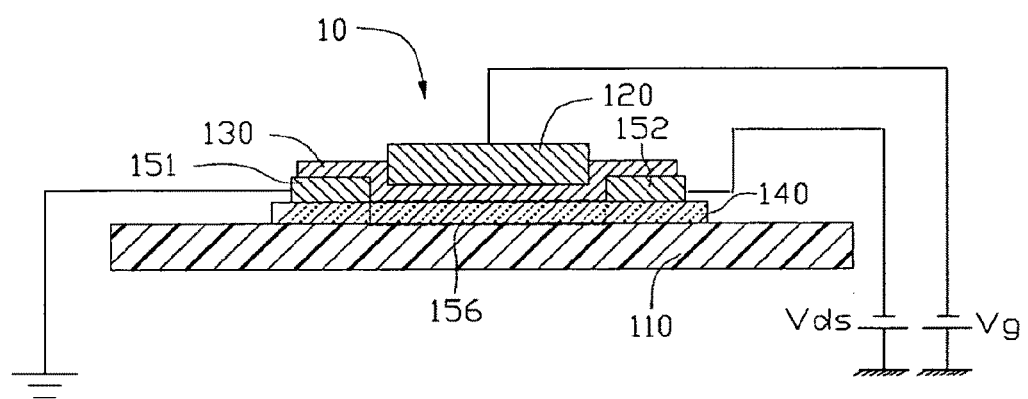
FIG. 4 is a schematic view of the thin film transistor of FIG. 1 connected to a circuit.

Referring to FIG. 4, in use, the source electrode 151 is grounded. A voltage $V_{ds}$ is applied on the drain electrode 152. Another voltage $V_g$ is applied to the gate electrode 120. The voltage $V_g$ forms an electric field in the channel 156 of the semiconducting layer 140. Accordingly, carriers exist in the channel 156 nearing the gate electrode 120. As $V_g$ increases, current can flow from the source electrode 151 to the drain electrode 152 through the channel 156, thus the thin film transistor 10 is in an ON state, the source electrode 151 and the drain electrode 152 are electrically connected. When the semiconducting layer 140 is made semiconducting carbon nanotube layer, and the diameter of the carbon nanotubes in the semiconducting layer 140 is less 2 nanometers, a high on/off current ratio is achieved that can be well used in the thin film transistor 10. The carrier mobility of the thin film transistor 10 in the present embodiment is higher than 10

$cm^2/V^{-1}s^{-1}$ (e.g., 10 to 1500 $cm^2/V^-s^{-1}$), and the on/off current ratio ranges range from about $1.0\times10^6$ to about $1.0\times10^8$.

Figure 5:
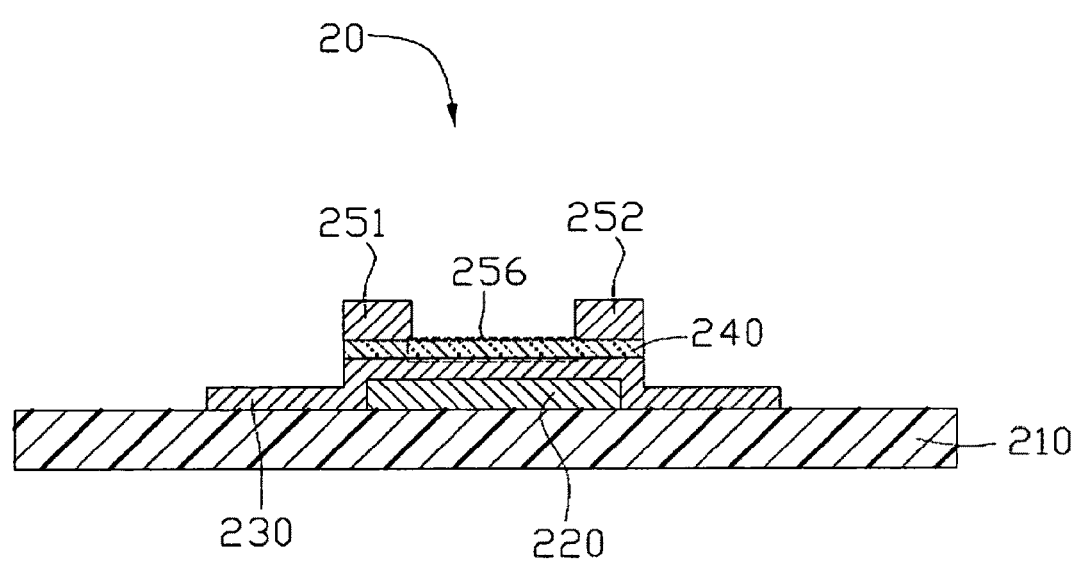
FIG. 5 is a cross sectional view of a thin film transistor in accordance with a second embodiment.

Referring to FIG. 5, a thin film transistor 20 according to a second embodiment has a bottom gate structure. The thin film transistor 20 includes a gate electrode 220, an insulating layer 230, a semiconducting layer 240, a source electrode 251, and a drain electrode 252. The thin film transistor 20 is located on an insulating substrate 210.

The structure of the thin film transistor 20 in the second embodiment is similar to the thin film transistor 10 in the first embodiment. The difference is that, in the second embodiment, the gate electrode 220 is located on the insulating substrate 210. The insulating layer 230 covers the gate electrode 220. The semiconducting layer 240 is located on the insulating layer 230, and insulated from the gate electrode 220 by the insulating layer 230. The source electrode 251 and the drain electrode 252 are spaced apart from each other and electrically connected to the semiconducting layer 240. The source electrode 251, and the drain electrode 252 are insulated from the gate electrode 220 by the insulating layer 230. A channel 256 is formed in the semiconducting layer 240 at a region between the source electrode 251 and the drain electrode 252.

The channel 256 can be made of a carbon nanotube array that includes a plurality of ordered semiconducting carbon nanotubes. The channel 256 can also be made of a free-standing carbon nanotube film that includes a plurality of semiconducting carbon nanotubes. The free-standing carbon nanotube film is isotropic, and the carbon nanotubes in the free-standing carbon nanotube film are disordered, and entangled with each other.

The source electrode 251 and the drain electrode 252 can be located on the semiconducting layer 240 or on the insulating layer 230. More specifically, the source electrode 251 and the drain electrode 252 can be located on a top surface of the semiconducting layer 240, and on a same side of the semiconducting layer 240 with the gate electrode 220. In other embodiments, the source electrode 251 and the drain electrode 252 can be located on the insulating layer 230 and covered by the semiconducting layer 240. The source electrode 251 and the drain electrode 252 are located on different sides of the semiconducting layer 240. In other embodiments, the source electrode 251 and the drain electrode 252 can be formed on the insulating layer 230, and coplanar with the semiconducting layer 240.

The thin film transistors provided in the present embodiments have at least the following superior properties. Firstly, since the semiconducting carbon nanotube layer just includes a plurality of semiconducting carbon nanotubes with a smaller diameter (less 2 nanometers), and the energy gap of the semiconducting is in inverse proportion to the diameter of the carbon nanotubes, and thus, the on/off current ratio of the thin film transistor using the carbon nanotube layer as a semiconducting layer is relatively high. Secondly, the semiconducting carbon nanotube layer is durable at high temperatures. Thirdly, the tangled carbon nanotubes in the semiconducting carbon nanotube layer form a network structure. The network structure includes a plurality of micropores formed by the disordered carbon nanotubes. Thus, the thin film transistor using the semiconducting carbon nanotube layer as semiconducting layer will have a high light transmittance.

It is to be understood that the above-described embodiments are intended to illustrate rather than limit the invention. Variations may be made to the embodiments without departing from the spirit of the invention as claimed. The above-described embodiments illustrate the invention but do not restrict the scope of the invention.

The invention claimed is:

1. A thin film transistor comprising:
a source electrode;
a drain electrode spaced from the source electrode;
a semiconducting layer connected to the source electrode and the drain electrode, the semiconducting layer comprising a carbon nanotube layer, and the carbon nanotube layer comprising a plurality of semiconducting carbon nanotubes;
an insulating layer; and
a gate electrode insulated from the source electrode, the drain electrode, and the semiconducting layer by the insulating layer, wherein the carbon nanotubes in the carbon nanotube layer are disordered, and entangled with each other.

2. The thin film transistor as claimed in claim 1, wherein a diameter of the plurality of semiconducting carbon nanotubes is 2 nanometers or less.

3. The thin film transistor as claimed in claim 1, wherein the plurality of semiconducting carbon nanotubes are single-walled carbon nanotubes, double-walled carbon nanotubes, or any combination thereof.

4. The thin film transistor as claimed in claim 1, wherein the carbon nanotube layer comprises a plurality of micropores.

5. The thin film transistor as claimed in claim 4, wherein a diameter of the micropores is less than 50 microns.

6. The thin film transistor as claimed in claim 1, wherein a material of the insulating layer comprises a material that is selected from a group consisting of silicon nitride, silicon dioxide, polyethylene terephthalate, benzocyclobutenes, and acrylic resins.

7. The thin film transistor as claimed in claim 1, wherein a material of the source electrode, drain electrode, or gate electrode comprises a material that is selected from a group consisting of pure metals, metal alloys, indium tin oxide, antimony tin oxide, silver paste, conductive polymer, metallic carbon nanotubes and combinations thereof.

8. The thin film transistor as claimed in claim 7, wherein a material of the source electrode, drain electrode, or gate electrode comprises a material that is selected from a group consisting of aluminum, copper, tungsten, molybdenum, gold, cesium, palladium and combinations thereof.

9. The thin film transistor as claimed in claim 1, wherein the insulating layer is located between the semiconducting layer and the gate electrode.

10. The thin film transistor as claimed in claim 1, wherein the semiconducting layer is located on an insulating substrate, the source electrode and the drain electrode are located on a surface of the semiconducting layer, the insulating layer is located on the semiconducting layer, and the gate electrode is located on the insulating layer.

11. The thin film transistor as claimed in claim 10, wherein a material of the insulating substrate comprises a material that is selected from a group consisting of silicon nitride, silicon dioxide, polyethylene terephthalate, benzocyclobutenes, and acrylic resins.

12. The thin film transistor as claimed in claim 10, wherein the source electrode and the drain electrode are located on a same side of the semiconducting layer as the gate electrode.

13. The thin film transistor as claimed in claim 10, wherein the source electrode and the drain electrode are located on different sides of the semiconducting layer.

14. The thin film transistor as claimed in claim 1, wherein the gate electrode is located on an insulating substrate, the insulating layer is located on the gate electrode, the semiconducting layer is located on the insulating layer, and the source electrode and the drain electrode are located on a surface of the semiconducting layer.

15. The thin film transistor as claimed in claim 1, further comprising a channel formed in the semiconducting layer at a region between the source electrode and the drain electrode, a length of the channel ranging from about 1 micron to about 100 microns, and a width of the channel ranging from about 1 micron to about 1 millimeter.

16. The thin film transistor as claimed in claim 15, wherein the channel is defined in the carbon nanotube layer, the carbon nanotube layer is isotropic, and the carbon nanotubes in the carbon nanotube layer are disordered, and entangled with each other.

17. The thin film transistor as claimed in claim 1, wherein a on/off current ratio ranges from about $1.0 \times 10^6$ to about $1.0 \times 10^8$.

18. A thin film transistor comprising:
a source electrode;
a drain electrode spaced from the source electrode;
a semiconducting layer connected to the source electrode and the drain electrode, the semiconducting layer comprising a carbon nanotube layer, and the carbon nanotube layer comprising a plurality of semiconducting carbon nanotubes;
an insulating layer; and
a gate electrode insulated from the source electrode, the drain electrode, and the semiconducting layer by the insulating layer, wherein the gate electrode is located on an insulating substrate, the insulating layer is located on the gate electrode, the semiconducting layer is located on the insulating layer, and the source electrode and the drain electrode are located on a surface of the semiconducting layer.

19. The thin film transistor as claimed in claim 18, wherein the carbon nanotubes in the carbon nanotube layer are disordered, and entangled with each other.

20. A thin film transistor comprising:
a source electrode;
a drain electrode spaced from the source electrode;
a semiconducting layer connected to the source electrode and the drain electrode, the semiconducting layer being consisted of a carbon nanotube array, and the carbon nanotube array comprising a plurality of semiconducting carbon nanotubes, the plurality of semiconducting carbon nanotubes having a diameter in a range from about 1 nanometer to about 2 nanometers;
an insulating layer; and
a gate electrode insulated from the source electrode, the drain electrode, and the semiconducting layer by the insulating layer, wherein the gate electrode is located on an insulating substrate, the insulating layer is located on the gate electrode, the semiconducting layer is located on the insulating layer, and the source electrode and the drain electrode are located on a surface of the semiconducting layer.

* * * * *